(12) United States Patent
Ishizaki (10) Patent No.: US 7,091,526 B2
(45) Date of Patent: Aug. 15, 2006

(54) LIGHT EMITTING DEVICE AND METHOD OF FABRICATING THE SAME

(75) Inventor: Jun-ya Ishizaki, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 10/852,256

(22) Filed: May 25, 2004

(65) Prior Publication Data

US 2004/0211969 A1 Oct. 28, 2004

Related U.S. Application Data

(63) Continuation-in-part of application No. PCT/JP02/11425, filed on Nov. 1, 2002.

(30) Foreign Application Priority Data

Nov. 30, 2001 (JP) ............................. 2001-366087

(51) Int. Cl.
*H01L 33/00* (2006.01)
(52) U.S. Cl. ..................... 257/101; 257/94; 257/103
(58) Field of Classification Search ........... 257/88–103
See application file for complete search history.

(56) References Cited

U.S. PATENT DOCUMENTS 5,563,422 A 10/1996 Nakamura et al.
5,925,896 A 7/1999 Dutta
6,057,561 A 5/2000 Kawasaki et al.

FOREIGN PATENT DOCUMENTS

| EP | 0 025 324 | 3/1981 |
|---|---|---|
| EP | 1 199 755 A1 | 4/2002 |
| JP | 2001-036130 | 2/2001 |
| JP | 2001-044495 | 2/2001 |
| JP | 2001-210864 | 8/2001 |
| WO | WO 01/08229 A1 | 2/2001 |

OTHER PUBLICATIONS

Ota, Hiromichi et al., "Development of Near UV-Emitting Diode Using Transparent Oxide Semiconductors," *Ceramics*, 2001, pp. 285-288, vol. 36, No. 4.

*Primary Examiner*—Cuong Nguyen
(74) *Attorney, Agent, or Firm*—Snider & Associates; Ronald R. Snider (57) ABSTRACT

A light emitting device 100 has a light emitting layer portion 9 which comprises an active layer 5 composed of an $Mg_xZn_{1-x}O$-type oxide semiconductor, a p-type cladding layer 6 again composed of an $Mg_xZn_{1-x}O$-type oxide semiconductor, and an n-type cladding layer 3. On the p-type cladding layer 6 of the light emitting layer portion 9, a light extraction layer 7 is configured using an oxide, where the light extraction layer 7 has a refractive index at a dominant emission wavelength of light extracted from the active layer 5 smaller than that of the cladding layers 3,6. This makes it possible to efficiently extract the light emitted from the light emitting layer portion 9 to the external of the light emitting device 100. This is it successful in providing a high-light-extraction-efficiency light emitting device having the light emitting layer portion composed of an oxide semiconductor, and a method of fabricating the same.

4 Claims, 6 Drawing Sheets

LIGHT EMITTING DEVICE AND METHOD OF FABRICATING THE SAME

This application is a Continuation-In-Part of PCT Application No. PCT/JP02/11425 filed on Nov. 1, 2002. This application also claims the priority of Japanese Patent Application No. 2001-366087 filed on Nov. 30, 2001, which is incorporated herein by reference.

FIELD OF THE INVENTION

This invention relates to a light emitting device and a method of fabricating the same.

BACKGROUND ART

To what degree light emission can occur in a light emitting layer portion, which comprises an active layer and cladding layers, is an important index for performances of light emitting devices such as light emitting diode and semiconductor laser. An exemplary configuration popularly adopted is double heterostructure, in which the cladding layers and so forth, which function as confining and injecting carriers, are designed to be transparent to the light emission from the active layer (designed to have a band gap energy wider than a photon energy corresponded to the emission wavelength), and so as to sandwich the active layer. Increase in difference in the band gap energy between the active layer and cladding layers can improve internal quantum efficiency, and this consequently raises emission efficiency of the light emitting device.

On the other hand, improvement in external quantum energy (extraction efficiency of light out into the external of the light emitting device: simply referred to as light extraction efficiency, hereinafter) is also important, in addition to the improvement in the internal quantum efficiency. In consideration of the light extraction efficiency towards the external, difference in refractive index between different materials is an important issue. Assuming now that refractive index of the active layer as $n_1$ and refractive index of the cladding layer as $n_2$, a critical angle of total reflection $\theta_c$ of incident light from the active layer into the cladding layer is expressed as $$\theta_c = \text{Sin}^{-1}(n_2/n_1) \qquad (i)$$

The larger the difference in the refractive index between the different materials grows, the smaller the critical angle of total reflection on the interface between the different materials will be, therefore, in the above exemplary case, as the difference between refractive index $n_1$ of the active layer and refractive index $n_2$ of the cladding layer grows larger, the light emitted from the active layer will be more likely to cause total reflection on the interface with the cladding layer, and this consequently lowers the light extraction efficiency. The same will apply also to propagation of light from the cladding layer out into the external atmosphere.

Figure 7A:
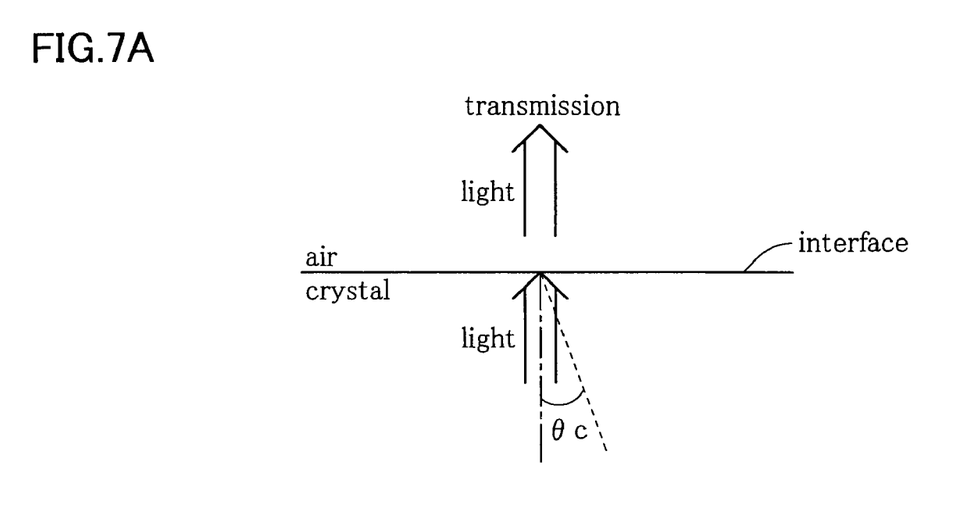
FIG. 7A is a first conceptual drawing explaining lowering in light extraction efficiency due to total reflection.
Figure 7B:
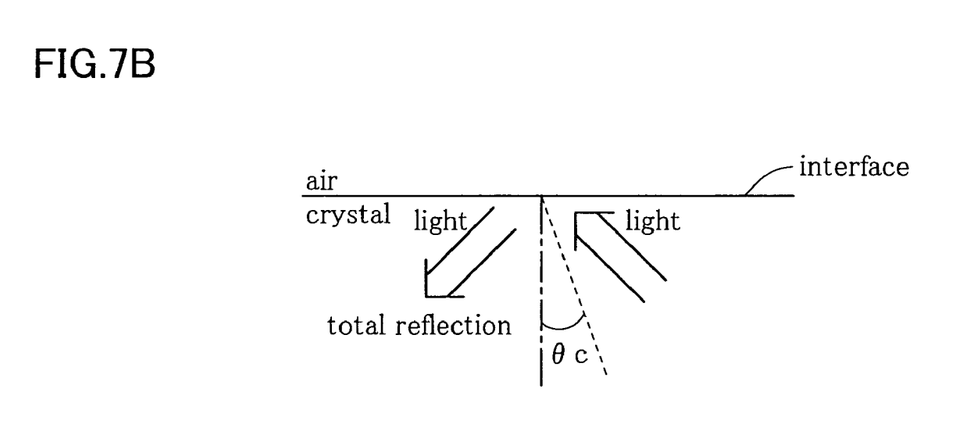
FIG. 7B is a second conceptual drawing explaining the same.

The lowering in the light emission efficiency due to total reflection will be explained referring to FIGS. 7A and 7B. Assuming now that critical angle of total reflection at the interface between a crystal body and an external atmosphere (air) as $\theta_c$, light having an angle of incidence smaller than $\theta_c$ will be extracted after transmitting through the interface out into the external (air) as shown in FIG. 7A. On the other hand, light having an angle of incidence larger than $\theta_c$ will totally be reflected on the interface as shown in FIG. 7B, and therefore will not be extracted outside the light emitting device.

To suppress the lowering in the light extraction efficiency due to total reflection, efforts have been made on reducing light energy to be totally reflected through fine processing of the device surface so as to increase the surface area, or on improving the light extraction efficiency through increasing light energy possibly extracted from the lateral sides by thickening layers other than the active layer, typically by thickening the cladding layers, for example. These methods are, however, disadvantageous in that they inevitably increase the number of process lines or material consumption, to thereby raise the production cost.

An object of this invention is therefore to provide a light emitting device having a desirable light extraction efficiency, and a method of fabricating the same.

DISCLOSURE OF THE INVENTION

In view of solving the above-described subject, a light emitting device of this invention is characterized in comprising a light emitting layer portion composed of an oxide semiconductor; and a light extraction layer composed of an oxide, disposed at least on one side of the light emitting layer portion, and having a refractive index at a dominant emission wavelength of light extracted from an active layer smaller than that of the light emitting layer portion.

This configuration can moderate decrease in the light extraction efficiency induced by total reflection, as compared with the case where the light emitting layer portion is directly exposed to the outer environment. More specifically, by forming a light extraction layer having a refractive index only slightly smaller than that of the light emitting layer portion on the outer side of the light emitting layer portion, it is made possible to reduce difference in refractive index at the interface between the outer environment (e.g., air: refractive index≈1) or a protective film of the light emitting device (e.g., epoxy resin: refractive index=1.5), and the light emitting device, to increase critical angle $\theta_c$ of total reflection at the interface of the light emitting device, and to thereby decrease a ratio of emission flux returned into the device. The light extraction layer can also function as a waveguide for allowing a part of the emission flux introduced into the own body to propagate towards the side faces of the layer based on multiple reflection, and can increase an amount of light energy extracted from the side faces of the layer. By virtue of these advantages, the present invention makes it possible to extract a larger amount of light energy towards the external of the light emitting device.

It has been confirmed that oxides such as $Mg_xZn_{1-x}O$-type oxide (also referred to as MgZnO-type oxide, hereinafter) and $SiO_2$ generally have small refractive indices. For example, the MgZnO-type oxide has an refractive index of approximately 1.9 to 2 for an MgO alloy composition x of 0.15, and of as small as approximately 1.8 for an MgO alloy composition x of 0.6. Refractive indices of MgO and $SiO_2$ are reduced to as small as approximately 1.7 and 1.5, respectively. It has, however, been difficult to use these low-refractive-index materials as the light extraction layer of light emitting devices, of which light emitting layer portions are composed of conventionally-developed, oxygen-incompatible materials such as AlGaAs-base, GaAsP-base, AlGaInP-base and InGaN-base materials, because formation of the above-described oxides as the light extraction layer in the fabrication process inevitably exposes the light emitting layer portion to a high-temperature oxidative atmosphere, and this is causative of damage or functional degradation of the light emitting layer portion. In contrast to this, the light emitting device of this invention, of which light emitting layer portion is composed of the oxide semiconductor, makes it possible to form the light extraction layer using the above-described, low-refractive-index oxide without any fear of damage or functional degradation of the light emitting layer portion.

The light emitting layer portion may be configured so that the active layer is composed of an oxide semiconductor containing at least Zn, and a cladding layer is composed of an $Mg_xZn_{1-x}O$-type (where, $0 \leqq x \leqq 1$) oxide semiconductor. This configuration successfully allows emission of light having a dominant emission wavelength of approximately 280 to 570 nm, covering the ultraviolet to green region. This invention is preferably applicable in particular to the light emitting devices having emission wavelengths from ultraviolet to blue regions, for which further improvement in the emission efficiency has been demanded. The refractive index of the MgZnO-type oxide semiconductor for composing the cladding layers is adjusted to approximately 1.8 to 2. Because the light extraction layer composed of MgO or $SiO_2$ will have a refractive index of approximately 1.7 or 1.5, respectively, as described in the above, the cladding layers are configured using an MgZnO-type oxide semiconductor having a refractive index larger than these values.

The light extraction layer preferably has a refractive index at a dominant emission wavelength of light extracted from the active layer larger than that of the protective film of the light emission device. It is often the case that the protective film for protecting the main body of the light emitting device is formed around the light emitting device. The light extraction layer in this case is formed using an oxide having a refractive index larger than that of the protective film, in order to suppress total reflection at the interface between the light extraction layer and the protective film.

For more enhanced expression of effects of this invention, the light extraction layer preferably comprises a plurality of stacked layers which differ from each other in the refractive index, the layers being stacked so that the one disposed closer to the topmost surface side always has a smaller refractive index. A smaller difference between refractive indices of the light extraction layer and a medium composing the ambient atmosphere (air, protective film, etc.) results in a larger critical angle of total reflection on the surface of the light extraction layer, and therefore results in a larger light extraction efficiency from the light extraction layer. For the case where the light extraction layer is composed of a single species of oxide, a smaller refractive index of the oxide to be used emphasizes this tendency. Too small refractive index of the oxide semiconductor in this case, however, increases difference between refractive indices of the light emitting layer portion (cladding layer) and light extraction layer, and may raise a problem of total reflection at the interface of the both. It is therefore preferable herein to form the light extraction layer as having a plurality of layers as described in the above, so that a layer disposed more closer to the topmost surface side of the light extraction layer will always have a smaller refractive index, and this is successful in reducing difference in refractive indices at the all interfaces between the light emitting layer portion and light extraction layer, between the individual layers composing the light extraction layer, and between the light extraction layer and ambient atmosphere, and in making the total reflection less likely to occur. In other words, the light extraction layer will have a structure in which the refractive index gradually decreases towards the topmost surface in the thickness-wide direction, and formation of thus-configured light extraction layer can prevent the interface where the refractive index can extremely vary from being formed between the light emission layer portion and ambient atmosphere even if differences in the refractive indices therebetween is considerably large, and is consequently more successful in reducing a ratio of emission flux possibly returned to the light emitting layer portion due to total reflection.

It is to be noted that the refractive index may continuously be varied within the light extraction layer in the thickness-wise direction (in an exemplary case where $Mg_xZn_{1-x}O$-type oxide is used in this structure, this is accomplished by continuously varying MgO alloy composition x in the thickness-wise direction). This is successful in almost completely suppressing the total reflection at intermediate positions in the light extraction layer.

On the other hand, for the case where the refractive index is step-wisely varied in the thickness-wise direction, the individual layers will have the interfaces on both main surfaces thereof where the refractive index will discontinuously vary and therefore can cause some degree of total reflection, wherein discontinuity of the refractive index at the interface is reduced to a degree expected from the fact that difference in the refractive indices between the cladding layer side and a medium composing the ambient atmosphere is distributed over a plurality of light extraction layers (i.e., critical angle of total reflection increases). This can still ensure that absorption loss due to the total reflection is less likely to occur, and can also ensure that the individual layers will have a function of waveguide based on multiple reflection even if the total reflection should occur, and this is advantageous in increasing an amount of light energy extractable out from the side faces of the layer. For the purpose of enhancing a preventive effect against the total reflection through adoption of the multi-layered structure, it is preferable to suppress the difference in the refractive indices between the layers to as small as 0.3 or less. On the other hand, for the purpose of allowing the individual layers to function as waveguides (i.e., for the purpose of enhancing the light extraction efficiency from the side faces), it is preferable to secure the difference in the refractive indices between the layers of as large as 0.1 or above.

For the case where the cladding layer is composed of the MgZnO-type oxide semiconductor, the light extraction layer is preferably composed of an $Mg_xZn_{1-x}O$-type oxide layer having an MgO alloy composition x larger than that of the cladding layer. The MgZnO-type oxide has a tendency of reducing its refractive index as the MgO alloy composition x increases. The above-described configuration is thus successful in realizing the light extraction layer having a refractive index smaller than that of the cladding layer. More specifically, the light extraction layer having the topmost surface thereof composed of an MgO layer is adoptable. Use of an MgO layer, which is an MgZnO-type oxide having the largest alloy composition x, for the topmost surface of the light extraction layer is successful in readily realizing the configuration of this invention, which is typified by the case where the cladding layer is configured using an MgZnO-type oxide semiconductor layer. It is of course allowable to configure the light extraction layer solely by an MgO layer.

It is also allowable to configure the light extraction layer mainly by a $SiO_2$ layer. $SiO_2$ has a refractive index of approximately 1.5, and is preferably used for composing the light extraction layer. Use of epoxy resin (refractive index≈1.5), for example, for the protective film of the light emitting device can reduce difference in the refractive index between the main body of the light emitting device and the protective film, and can successfully suppress the total reflection at the interface between the light extraction layer and the protective film.

For the case where the light extraction layer is configured using the above-described oxide, an applicable method of fabricating such light emitting device of this invention is as follows. That is, the method is characterized in comprising a step of forming a light extraction layer including either an $Mg_xZn_{1-x}O$-type (where, $0 \leq x \leq 1$) oxide layer or a $SiO_2$ layer, on the surface of a light emitting layer portion composed of an oxide semiconductor. Because the light emitting device of this invention has the light emitting layer portion composed of an oxide semiconductor, it is made possible to form the light extraction layer using an oxide, which has been difficult in other type of light emitting device having the light emitting layer portion composed of a material other than oxide. It is also allowable for the light emitting layer portion of the light emitting device that an active layer is composed of an oxide semiconductor containing at least Zn, and that cladding layers are composed of an $Mg_xZn_{1-x}O$-type (where, $0 \leq x \leq 1$) oxide semiconductor. For the case where the light extraction layer is formed as described in the above, the light extraction layer can be formed in an oxidative atmosphere, where the exposure herein to the oxidative atmosphere under high temperature will never cause damage of the light emitting layer portion, which is typically the cladding layer. This facilitates formation of the light extraction layer composed of an oxide. Because the cladding layer is composed of the MgZnO-type oxide semiconductor, it is also made possible to form the light extraction layer composed of an oxide in the same reaction furnace, and this is expectant of simplification of the fabrication process.

BEST MODES FOR CARRYING OUT THE INVENTION

The following paragraphs will describe best modes for carrying out this invention referring to the attached drawings.

Figure 1:
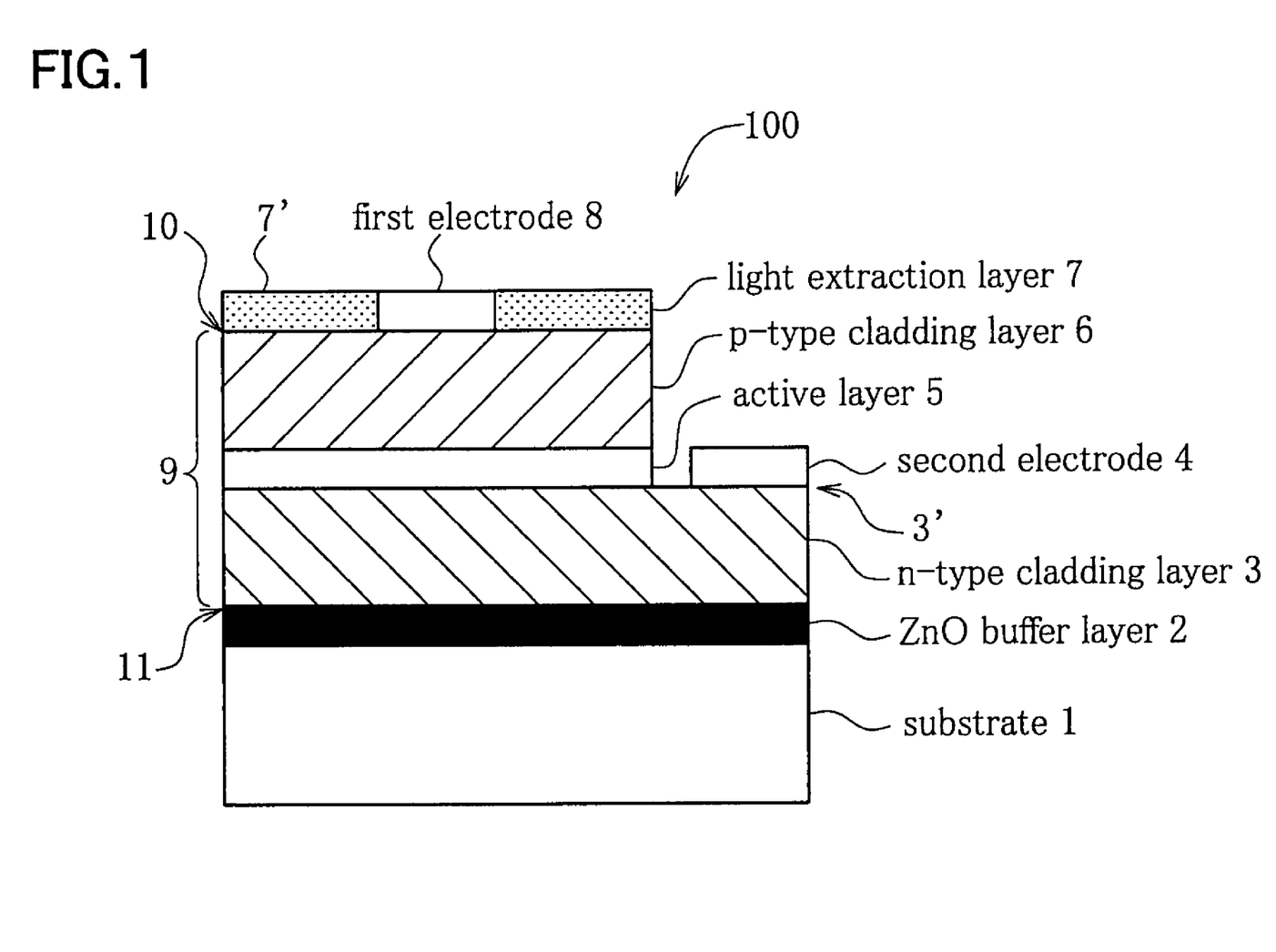
FIG. 1 is a schematic sectional view showing an exemplary light emitting device of this invention.

FIG. 1 is a schematic sectional view showing an exemplary configuration of a light emitting device of this invention. A light emitting device 100 has a light emitting layer portion 9, on a first surface 10 of which a first electrode 8 is formed. In the area of the first surface 10 having no first electrode 8 formed thereon, a light extraction layer 7 is formed. The light emitting layer portion 9 has a double heterostructure which typically comprises an active layer 5 composed of an $Mg_xZn_{1-x}O$-type oxide semiconductor, a p-type cladding layer 6 again composed of an $Mg_xZn_{1-x}O$-type oxide semiconductor, and an n-type cladding layer 3 (both cladding layers will also generally be referred to as the cladding layers 6,3, hereinafter).

In this embodiment, an MgO alloy composition x of the MgZnO-type oxide semiconductor composing the active layer 5 may be zero. That is, the active layer 5 may be composed of ZnO. It is also allowable in this invention that the light emitting layer portion 9 is composed of an oxide semiconductor other than MgZnO-type oxide, where other oxide is typified by ZnCdO-type oxide. It is still also allowable to use an alloy of the ZnCdO-type oxide and MgZnO-type oxide. The oxide semiconductor used for the active layer 5 is properly selected depending on a target emission wavelength. Use of the MgZnO-type oxide semiconductor, ZnCdO-type oxide semiconductor or any alloys of the both makes it possible to generate light having a dominant emission wavelength of 280 to 570 nm.

When the active layer 5 is composed of the MgZnO-type oxide semiconductor in this embodiment, the p-type cladding layer 6 and the n-type cladding layer 3 are designed so as to have an MgO alloy composition x larger than that of the active layer 5, and also designed so as to have a band gap energy larger than that of the active layer 5. This is successful in enhancing confinement effect of carriers in the active layer 5, and in consequently improving the internal quantum efficiency in the light emitting layer portion 9. This is also advantageous in that the light generated in the active layer 5 becomes less likely to be absorbed by the cladding layers 6, 3, and in keeping the light extraction efficiency at a desirable level. Even for the case where the active layer 5 is not composed of the MgZnO-type oxide semiconductor, it is also preferable to similarly adjust the MgO alloy composition x of the cladding layers 6, 3 so as to have a band gap energy larger than that of the active layer 5.

In this embodiment, MgO (magnesium oxide) can typically be used as a material for composing the light extraction layer 7. MgO has a refractive index of approximately 1.7 at the dominant emission wavelength of light extracted from the active layer 5, which is smaller than the refractive index of the p-type cladding layer 6, and therefore can preferably be used as the light extraction layer 7. In another exemplary case, it is also allowable to configure the light extraction layer 7 using an MgZnO-type oxide having an MgO alloy composition x larger than that of the cladding layers 3, 6 composed of the MgZnO-type oxide. Larger MgO alloy composition x is convenient because it results in larger band gap energy and lower refractive index. It is preferable that the MgO alloy composition x of the light extraction layer 7 is adjusted so as to increase towards the topmost surface 7' side of the light extraction layer 7 in a continuous or step-wise manner. This makes the refractive index smaller and the band gap energy larger towards the top surface 7' side of the light extraction layer, and is not causative of any problem in transmissivity of light.

Because MgO is an insulator, use of MgO as the light extraction layer 7 and formation of a first electrode 8 on such light extraction layer 7 will fail in obtaining a desirable ohmic contact, and will result in only an insufficient current supply to the light emitting layer portion 9. It is therefore preferable to form the first electrode 8 so as to contact with a part of the p-type cladding layer 6, and to form the MgO layer as the light extraction layer 7 on the surface of the p-type cladding layer 6 within an area having no first electrode 8 formed therein. On the other hand, if any conductive material is used for forming the light extraction layer 7, it is also allowable to form the light extraction layer 7 on the p-type cladding layer 6, and the first electrode 8 is formed further thereon, so far as a desirable current supply can be ensured. It is also allowable in this case to introduce dopant to the light extraction layer 7 so as to allow it to function also as a current spreading layer. Gold (Au) is preferably used for composing the first electrode 8 in view of ensuring a desirable current supply and wire bonding performance.

A second surface 11 of the light emitting layer portion 9 is bonded to a substrate 1 while placing a ZnO buffer layer 2 in between. The substrate 1 is composed by using an oxide such as aluminum oxide, gallium oxide, magnesium oxide, zinc oxide, indium tin oxide or glass. On an opened surface 3' of the n-type cladding layer 3 having none of the active layer 5, the p-type cladding layer 6 and the light extraction layer 7 formed thereon, a second electrode 4 is formed. A transparent conductive film typically composed of indium tin oxide (ITO) is applicable to the second electrode 4.

The next paragraphs will describe a method of fabricating the above-described light emitting device 100.

The ZnO buffer layer 2 is epitaxially grown on the substrate 1, and further thereon, the n-type $Mg_xZn_{1-x}O$ cladding layer 3 (typically of 50 nm thick), the $Mg_xZn_{1-x}O$ active layer 5 (typically of 30 nm thick) and the p-type $Mg_xZn_{1-x}O$ cladding layer 6 (typically of 50 nm thick) are epitaxially grown in this order. These layers can be formed according to publicly-known MOVPE (Metal Organic Vapor Phase Epitaxy) process, or MBE (Molecular Beam Epitaxy) process.

Major source materials for the individual layers are as listed below.

Oxygen component source gas: preferably supplied in a form of an oxidative compound gas in view of suppressing excessive reaction with organo-metallic gases described later, although supply in a form of oxygen gas also allowable. Available examples include $N_2O$, NO, $NO_2$, CO and $H_2O$, where $N_2O$ (nitrous oxide) is used in this embodiment;

Zn source (metal component source) gas: dimethyl zinc (DMZn), diethyl zinc (DEZn), etc.; and Mg source (metal component source) gas: bis-cyclopentadiethynyl magnesium ($Cp_2Mg$), etc.

Examples of gases available as a p-type dopant gas are as follows.

Li source gas: n-butyl lithium, etc;
Si source gas: silicon hydrides such as monosilane, etc.
C source gas: hydrocarbon ($C_1$ or longer alkyl, etc); and
Se source gas: hydrogen selenide, etc.

Group III elements such as Al, Ga and In can be used in a singular manner or in combination of two or more, and co-addition with N, a Group V element, allows them to function as a desirable p-type dopant. Available examples of the dopant gas are listed below.

Al source gas: trimethyl aluminum (TMAl), triethyl aluminum (TEAl), etc.;
Ga source gas: trimethyl gallium (TMGa), triethyl gallium (TEGa), etc.; and
In source gas: trimethyl indium (TMIn), triethyl indium (TEIn), etc.

For the case where N is used as a p-type dopant together with a metal element (Ga), the p-type MgZnO cladding layer can be grown in a gas phase while supplying a N source gas together with a Ga source, organo-metallic gas. In this example, $N_2O$ used as an oxygen component source also functions as a N source.

The n-type cladding layer 3 can dope n-type carrier with any one, or two or more n-type dopants selected from Al, Ga and In. Dopant gas available herein is the same as described in the above.

After formation of the light emitting layer portion 9, the MgO layer which composes the light extraction layer 7 can be formed using a separate reaction furnace by the vapor-phase epitaxy process, deposition process or vacuum evaporation process, or can be formed in succession in the same reaction furnace in which the light emitting layer portion 9 was previously formed. For the case where the same reaction furnace is used in succession, the MgO layer can be formed by introducing only a Mg source gas, out of all metal component source gases listed in the above, into the furnace. This is convenient enough to omit an operation of transferring the substrate under the film growth to other process step, and to simplify the fabrication process.

After the light extraction layer 7 is formed as described in the above, a portion of the topmost of surface 7' of the light extraction layer 7 in which the electrode will be formed later is removed by photolithographic patterning, and the first electrode 8 is formed on the first surface side 10 of the p-type cladding layer 6 exposed after the removal of the light extraction layer 7, to thereby form an electrode. In a step of further forming the second electrode 4 on the n-type cladding layer opened surface 3', a predetermined portion of the light extraction layer 7, p-type cladding layer 6 and active layer 5 are partially removed typically by photolithography, and the second electrode 4 typically composed of ITO is formed on thus exposed n-type cladding layer opened surface 3'. The light emitting device 100 is supplied with current by applying positive voltage to the first electrode 8 and negative voltage to the second electrode 4.

Although the above-described embodiment dealt with the case where the insulating substrate 1 is used, and the second electrode 4 is formed on the n-type cladding layer opened surface 3', the second electrode 4 can be formed on the opposite surface of the substrate 1 with respect to the light emitting layer portion 9, if a conductive substrate 1 (e.g., zinc oxide (ZnO), etc.) is used.

Although the above-described embodiment dealt with the case where the n-type cladding layer 3, active layer 5 and p-type cladding layer 6 were formed in this order, it is also allowable to exchange the order of stacking of the n-type cladding layer 3 and p-type cladding layer 6, and to form the light extraction layer 7 on the surface of the n-type cladding layer 3.

Figure 2:
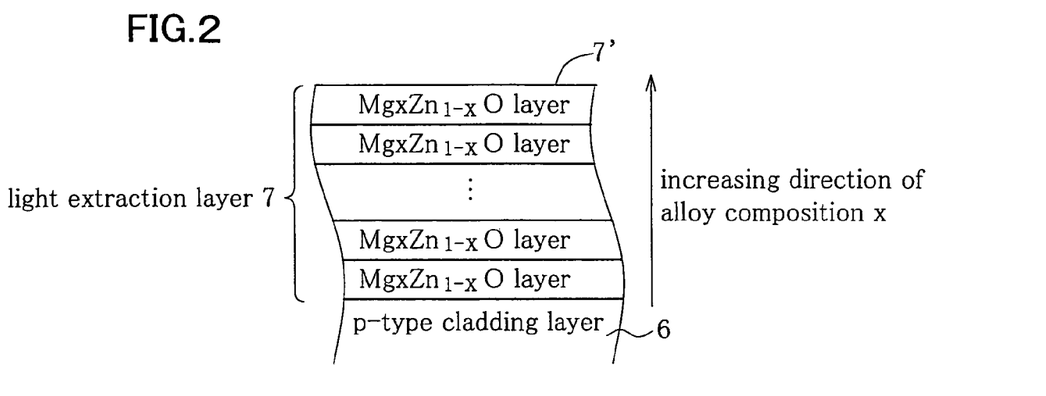
FIG. 2 is a schematic sectional view showing an exemplary configuration of a light extraction layer.
Figure 3:
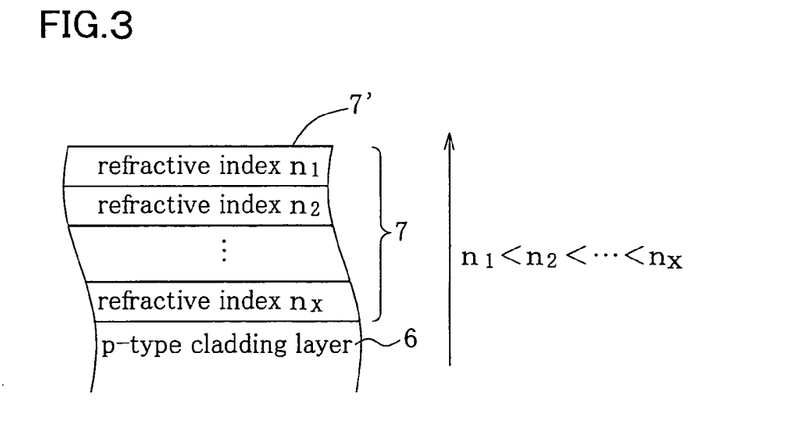
FIG. 3 is a schematic sectional view showing another exemplary configuration of a light extraction layer.
Figure 4:
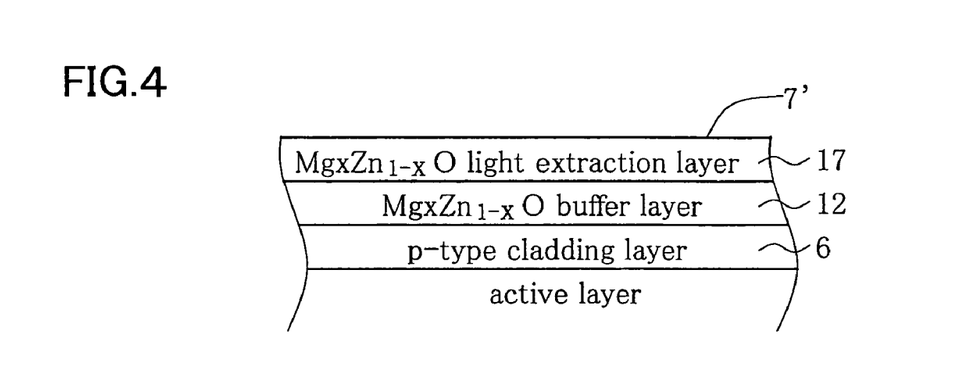
FIG. 4 is a schematic sectional view showing a modified example of this invention.

When the p-type cladding layer 6 is formed using the MgZnO-type oxide semiconductor and the light extraction layer 7 is formed using the MgZnO-type oxide layer having the MgO alloy composition x larger than that of the p-type cladding layer 6, it is also allowable, as shown in FIG. 2, to form the light extraction layer 7 so that the MgO alloy composition x thereof increases towards the topmost surface 7' side of the light extraction layer 7 in a continuous or step-wise manner. As a consequence as shown in FIG. 3, the light extraction layer 7 of the light emitting device 100 is composed of a plurality of layers which differ from each other in the refractive index, where the layers are stacked so that the one disposed closer to the topmost surface 7' side has always a smaller refractive index. This is successful in reducing relative difference in the refractive indices at the individual interfaces between the p-type cladding layer 6 and light extraction layer 7, between adjacent layers in the light extraction layer 7 and between the light extraction layer 7 and the external atmosphere, while suppressing lattice mismatching or the like. Thus configured light extraction layer 7 can be formed by the above-described method of fabricating the light emitting device based on the MOVPE process, in which content of $Cp_2Mg$ gas, which is an Mg source to be supplied, in the carrier gas is increased in a continuous or step-wise manner over a growth period of the light extraction layer 7. From the same point of view, as shown in FIG. 4, it is also allowable to form, between the p-type cladding layer 6 and a light extraction layer 17, an $Mg_xZn_{1-x}O$-type buffer layer 12 having an MgO alloy composition x adjusted to an intermediate value between those of the p-type cladding layer 6 and the light extraction layer 17.

Figure 5:
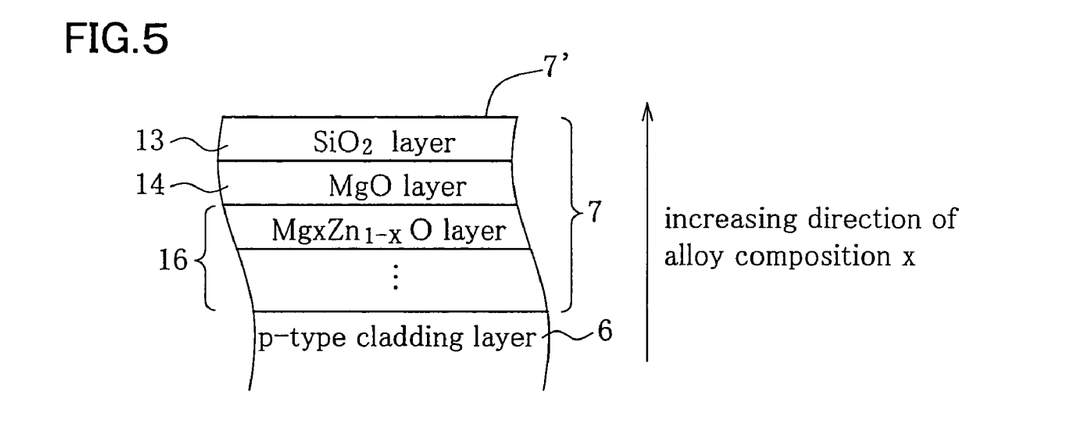
FIG. 5 is a schematic sectional view showing an exemplary configuration of a light extraction layer different from that shown in FIG. 3.

Another example of the case where the refractive index of the light extraction layer 7 is reduced towards the topmost surface 7' side thereof may be such that the light extraction layer 7 has, as shown in FIG. 5, an MgO layer 14 and a $SiO_2$ layer 13, and the $SiO_2$ layer 13 (refractive index≈1.5) is formed more closer to the topmost surface 7' side of the light extraction layer 7 than the MgO layer 14 (refractive index≈1.7) is. This makes the refractive index smaller towards the topmost surface 7' side of the light extraction layer 7, and more successfully exhibits the effect of this invention. In this case, it is also allowable that the light extraction layer 7 is mainly composed of the $SiO_2$ layer 13. It is still also allowable to dispose an $Mg_xZn_{1-x}O$ layer 16, as another layer for composing the light extraction layer 7, between the MgO layer 14 and p-type cladding layer 6, where the $Mg_xZn_{1-x}O$ layer 16 is designed so as to have the MgO alloy composition x increasing towards the topmost surface 7' side of the light extraction layer 7.

The oxide layers formed as the light extraction layer 7, such as the MgO layer 14 and the $SiO_2$ layer 13, can be formed by the vapor-phase epitaxy processes such as the CVD process and PVD process. As for the CVD process, it is preferable to adopt the MOVPE process which is suitable for forming the light emitting layer portion 9, because the process enables formation of these layers in succession to the formation of the light emitting layer portion 9. The PVD process can be exemplified by the vacuum evaporation process, ion plating process, and sputtering process.

The light extraction layer 7 may also be composed only of a $SiO_2$ layer. This is expectant of further improvement in the light extraction efficiency because the $SiO_2$ layer has a refractive index smaller than that of the MgO layer. The $SiO_2$ layer is preferably an amorphous $SiO_2$ layer in view of having no optical anisotropy and simplicity in the manufacture. This sort of amorphous $SiO_2$ layer can be formed not only by the CVD process, but also by spin-coating of a $SiO_2$ grain dispersion and successive annealing. Still other available methods include such as supplying monosilane gas and an oxidative gas such as oxygen into an MOVPE furnace; such as forming the layer by a reaction of Si molecular beam with an oxidative gas in an MBE chamber; and such as using pulsed laser deposition, and these methods are advantageous in that the light extraction layer 7 can be formed in a successive manner in the same growth furnace in which the light emitting layer portion 9 is formed.

In the light emitting device of this invention, the light emitting layer portion may be configured so that the active layer thereof is composed of an oxide semiconductor containing at least Zn, and a cladding layer thereof is composed of an oxide semiconductor consisting of copper oxide. The copper oxide may be either of $SrCu_2O_2$ and $CaCu_2O_2$. The copper oxide may be also any one of $CuAlO_2$, $GaCuO_2$ and $InCuO_2$.

Example

In this example, two types of the light emitting devices 100 having (1) no light extraction layer 7 (conventional example); and (2) the light extraction layer 7 only composed of the MgO layer (refractive index: approx. 1.7); are compared for the light extraction efficiency, where each light emitting device 100 being configured, as shown in FIG. 1, as having the active layer 5 composed of zinc oxide (ZnO), the p-type cladding layer 6 composed of the MgZnO-type oxide semiconductor, and being covered by an epoxy resin as a protective film on the outer surface thereof. The resin used herein is such as having a refractive index of approximately 1.5 (e.g., epoxy resin, etc.). The light extraction layer 7 is formed on the outer side of the p-type cladding layer 6. It is to be noted that, in this example, the individual interfaces are assumed as being formed flat, and light emitted from the active layer 5 is assumed to completely follow Snell's Law. The cladding layer herein is assumed to have a refractive index of 1.9, the light extraction layer described later of 1.7, the epoxy resin of 1.5 and the air of 1.0.

Figure 6A:
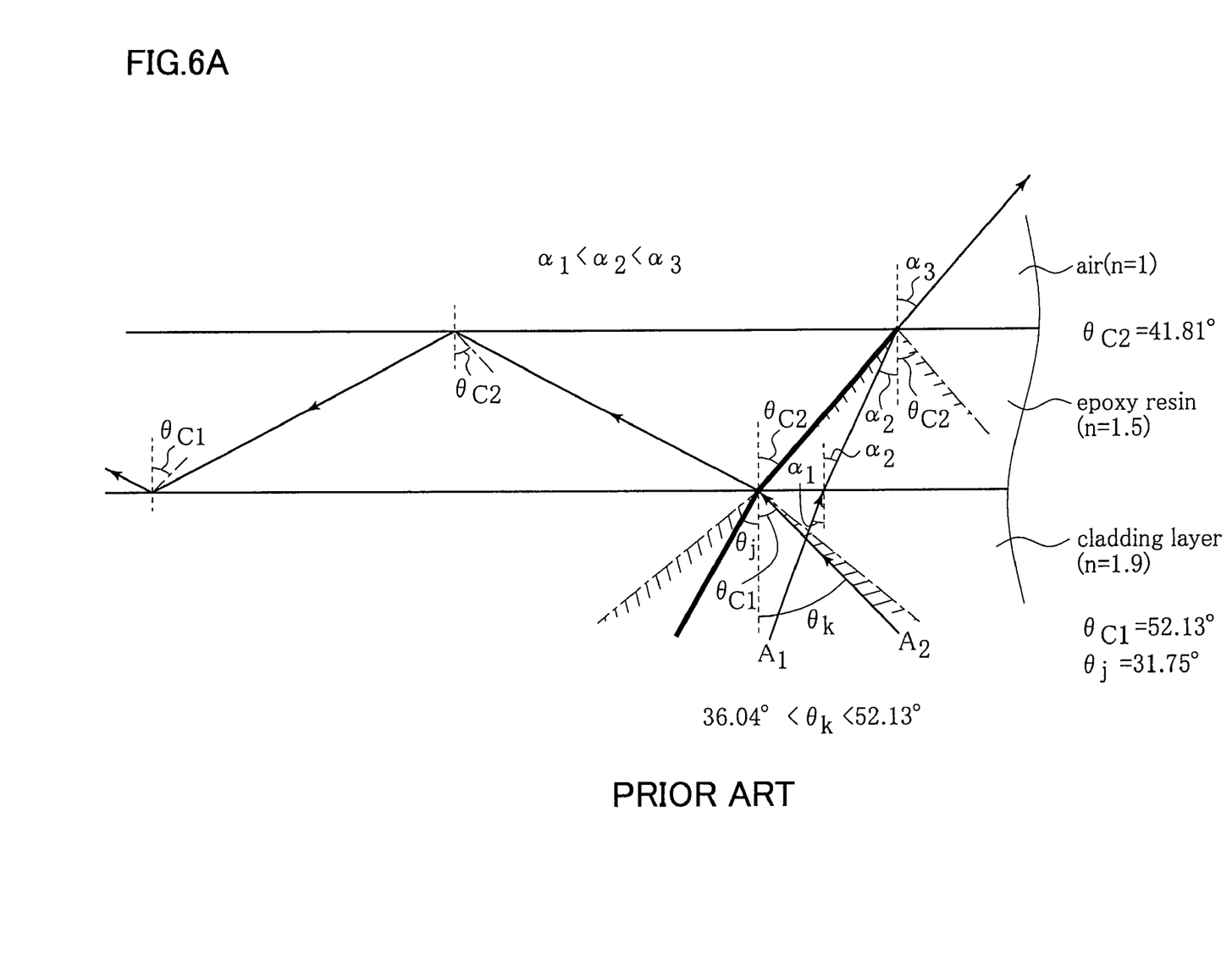
FIG. 6A is a schematic drawing showing a rough estimation of light extraction efficiency of a conventional example.

FIG. 6A is a drawing for explaining a case having no light extraction layer. Critical angle of total reflection $\theta_{c2}$ at the interface between the air and the epoxy resin is 41.81°, wherein flux of light incident on the epoxy resin always passes through the cladding layer/epoxy resin interface, so that an allowable angular range $\theta_j$, with respect to the epoxy resin, of flux of light A1 which can directly be extracted from the active layer in the direction towards the main surface is found to be within a range from 0° to 31.75° when calculated by adopting Snell's Law. Because refractive index decreases in the order of the cladding layer, epoxy resin and air, a relation of largeness of incident angles $\alpha 1$, $\alpha 2$ of flux of light A1 on the individual interfaces and an escape angle $\alpha 3$ out from the main surface of the epoxy resin can be given as $\alpha 1 < \alpha 2 < \alpha 3$. In other words, flux of light A1 is extracted from the main surface while being bent so as to gradually be inclined by refraction towards the side faces.

On the other hand, flux of light A2 incident on the epoxy resin with an angle larger than the angular range $\theta_j$ is totally reflected on the air/epoxy resin interface. Flux of light A2 can, however, be allowed to propagate towards the side faces of the layer after repeating the total reflection on the epoxy resin/cladding layer interface, if a certain range of incident angle is satisfied. In other words, the epoxy resin layer functions as a waveguide (it is to be noted, however, that the epoxy resin layer in a practical mold structure often has a form of shell or dome, so that it is not usual for the layer to function as an imaginary waveguide shown in the drawing). Considering now that critical angle of total reflection $\theta_{c1}$ at the interface between the epoxy resin and cladding layer is 52.13°, incident angle $\theta_k$ of flux of light capable of propagating within the epoxy resin layer based on the total reflection effect falls within a range from 31.75° (upper limit of $\theta_j$) to 52.13°. The flux of light can, however, be extracted from the side faces of the layer when the incident angle $\theta_k$ falls within a range from 36.04° to 52.13°, taking also the critical angle of total reflection on the side faces of the epoxy resin layer into consideration, when the side faces of the layer are normal to the main surface of the layer. Because there is almost no difference in refractive indices between the cladding layer and active layer, light totally reflected on the epoxy resin/cladding layer interface enters the active layer, and is absorbed. Ranges of incident angle of flux of light extractable out from the device to the epoxy resin layer are therefore defined by sums of the individual angular ranges of the escape light from the main surface as expressed by A1 in the drawing and of the escape light guided to the side faces of the epoxy resin layer as expressed by A2 in the drawing, which are ranges from 0° to 31.75°, and from 36.04° to 52.13°.

Figure 6B:
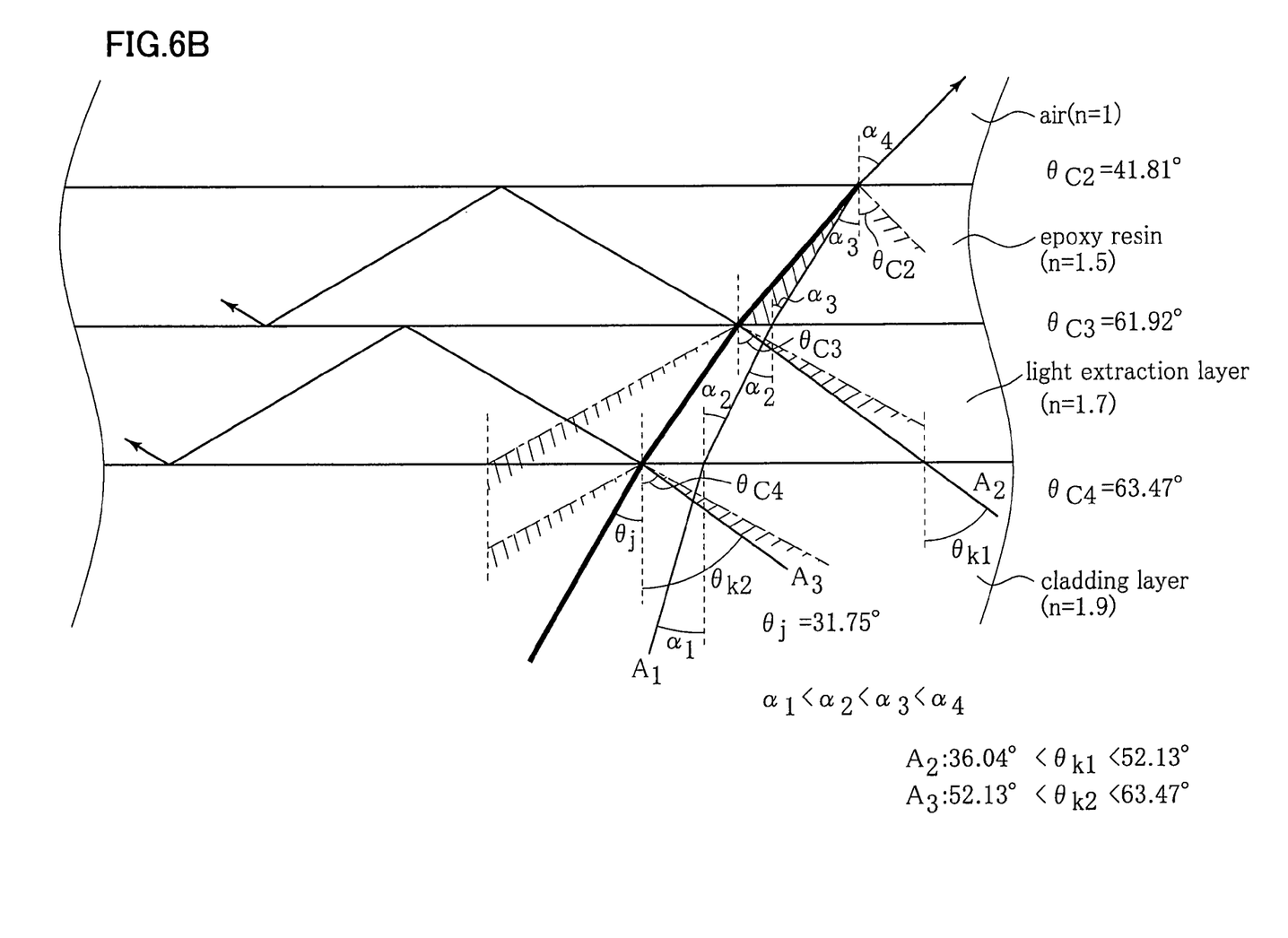
FIG. 6B is a schematic drawing showing a rough estimation of light extraction efficiency of an example of this invention.

Next, an explanatory drawing for a case inserted with a single light extraction layer having a refractive index of 1.7 or around is shown in FIG. 6B. Critical angle of total reflection $\theta_{c2}$ at the air/epoxy resin interface is 41.81°, wherein the flux of light incident on the epoxy resin always passes through two interfaces, that are the cladding layer/light extraction layer interface, and the light extraction layer/epoxy resin interface. However, allowable angular range $\theta_j$, with respect to the light extraction layer, of flux of light A1 directly extractable out from the active layer towards the direction of the main surface is consequently defined as 0° to 31.75°, based on a mathematical feature of Snell's Law. Because refractive indices decrease in the order of the cladding layer, light extraction layer, epoxy resin and air, a relation of largeness of incident angles $\alpha 1$, $\alpha 2$, $\alpha 3$ of flux of light A1 on the individual interfaces and an escape angle $\alpha 4$ from the surface of the epoxy resin can be expressed as $1<\alpha 2<\alpha 3<\alpha 4$. In other words, flux of light A1 is extracted out from the main surface again while being bent so as to gradually be inclined by refraction towards the side faces, wherein degree of inclination of A1 herein becomes larger than in the case shown in FIG. 6A, as being contributed by an increased number of times of refraction caused by insertion of the light extraction layer. For the case where the light extraction layer is composed of a conductive oxide (e.g., MgZnO-base oxide and ITO) and a part of the main surface of the layer is covered with a metal electrode, this contributes to successfully enhance an effect of allowing the emission flux in an area right under the metal electrode to obliquely bypass the metal electrode and to escape out from the peripheral area.

Again the epoxy resin layer functions as a waveguide. Although critical angle of total reflection $\theta_{c3}$ at the light extraction layer/epoxy resin interface is calculated as 61.92°, light extraction is made possible from the side faces of the epoxy resin layer only when incident angle $\theta_{k1}$ on the light extraction layer falls within a range from 36.04° to 52.13°. On the other hand, in the case shown in FIG. 6B, also the light extraction layer can function as a waveguide and allows light extraction from the side faces thereof. Conditions therefor are as follows. First, critical angle of total reflection $\theta_{c4}$ at the cladding layer/light extraction layer interface is calculated as 63.47° based on Snell's Law, and any flux of light incident with an angle in a range equal to or smaller than this value can transmit the interface. Flux of light having an incident angle of 36.04° to 52.13°, however, transmits also through the light extraction layer, and is guided within the epoxy resin layer. In order to generate flux of light A3 possibly guided within the light extraction layer based on total reflection on the light extraction layer/epoxy resin interface, it is therefore necessary to adjust incident angle $\theta_{k2}$ on the light extraction layer within a range from 52.13° to 63.47°. On the other hand, it is also necessary to take incident angle of the guided wave on the side faces of the light extraction layer into account, wherein critical angle of total reflection (equivalent to $\theta_{c3}$) is as large as 61.92° because the side faces of the light extraction layer are covered with the epoxy resin which is a resin film for molding. The guided wave can therefore go into the side faces of the light extraction layer without problem with an angle equal to or smaller than the above-described critical angle of total reflection even when incident angle $\theta_{k2}$ on the light extraction layer is as small as the lower limit (52.13°), and can escape out from the side faces into the epoxy resin layer. In other words, light guided within the light extraction layer can completely be extracted from the side faces. In conclusion, the incident angular ranges, on the light extraction layer, of the flux of light extractable towards the external of the device are therefore defined by sums of the individual angular ranges of the escape light from the main surface as expressed by A1 in the drawing, of the escape light guided to the side faces of the epoxy resin layer as expressed by A2 in the drawing, and of the escape light guided to the side faces of the light extraction layer as expressed by A3 in the drawing, which are ranges from 0° to 31.75°, and from 36.04° to 63.47°. From comparison with the case shown in FIG. 6A, it is obvious that the angular range allowing light extraction from the active layer increases as compared with the case having no light extraction layer inserted.

Comparison between the cases shown in FIG. 6A and FIG. 6B reveals that light extraction angle $\theta_k$ remains unchanged with respect to flux of light extracted out from the main surface side, whereas with respect to the extraction from the side faces based on the waveguide effect, the case shown in FIG. 6B showed an increase by 10° or more on the absolute angular value basis, and by as much as 20% or more on the ratio-of-increase basis, as compared with the case shown in FIG. 6A. It is to be noted that an actual light source in the active layer is not a point light source but a two-dimensional plane, wherein this is by no means contradictory to such approximated way of thinking described in the above, because integration of point light sources will reach the same conclusion with such spatially-spread light source.

Although the above-described example dealt with the case where the light emitting device 100 is covered with the resin, it is also allowable, in place of forming the resin, to form the above-described $SiO_2$ layer as a protective film in an amorphous state on the MgO layer. Amorphous $SiO_2$ layer having a refractive index of 1.5 or around can ensure the light extraction efficiency almost equivalent to that of the resin-covered light emitting device 100.

The invention claimed is:

1. A light emitting device comprising:
   a light emitting layer having an active layer and cladding layers and configured so that the active layer is composed of ZnO, MgZnO, or ZnCdO-type oxide and the cladding layers are composed of MgZnO;
   a light extraction layer composed of an oxide, disposed at least on one side of the light emitting layer portion, and having a refractive index at a dominant emission wavelength of light extracted from the active layer smaller than that of the light emitting layer portion; and
   wherein the light extraction layer comprises a plurality of stacked layers which differ from each other in the refractive index, the layers being stacked so that the one disposed closer to the topmost surface side always has a smaller refractive index.

2. A light emitting device comprising:
   a light emitting layer having an active layer and cladding layers and configured so that the active layer is composed of ZnO, MgZnO, or ZnCdO-type oxide and the cladding layers are composed of MgZnO;
   a light extraction layer composed of an oxide, disposed at least on one side of the light emitting layer portion, and having a refractive index at a dominant emission wavelength of light extracted from the active layer smaller than that of the light emitting layer portion;

wherein the light emitting layer portion is configured so that the active layer is composed of an oxide semiconductor containing at least Zn, and a cladding layer is composed of an $Mg_xZn_{1-x}O$-type (where, $0 \leq x \leq 1$) oxide semiconductor; and wherein the light extraction layer is composed of an $Mg_xZn_{1-x}O$-type oxide layer having an MgO alloy composition x larger than that of the cladding layer.

3. The light emitting device as claimed in claim 2, wherein the MgO alloy composition x of the light emitting layer portion increases towards the topmost surface side of the light extraction layer in a continuous or step-wise manner.

4. The light emitting device as claimed in claim 3, wherein the topmost surface of the light extraction layer is composed of an MgO layer.

* * * * *